United States Patent [19]
Chen et al.

[11] Patent Number: 5,561,620
[45] Date of Patent: Oct. 1, 1996

[54] FLASH EEPROM ARRAY WITH FLOATING SUBSTRATE ERASE OPERATION

[75] Inventors: Jian Chen, San Jose; Nader Radjy, Palo Alto, both of Calif.

[73] Assignee: Advanced Micro Devices, Inc., Sunnyvale, Calif.

[21] Appl. No.: 508,425

[22] Filed: Jul. 31, 1995

Related U.S. Application Data

[63] Continuation of Ser. No. 267,726, Jun. 28, 1994, abandoned.

[51] Int. Cl.$^6$ ........................................................ G11C 7/00
[52] U.S. Cl. ............... 365/218; 365/185.26; 365/185.27; 365/185.29
[58] Field of Search ..................................... 365/185, 184, 365/900, 218, 185.29, 185.26, 185.27

[56] References Cited

U.S. PATENT DOCUMENTS

| | | | |
|---|---|---|---|
| 4,250,569 | 2/1981 | Sasaki et al. | 365/185 |
| 4,698,787 | 10/1987 | Mukherjee et al. | 365/185 |
| 5,077,691 | 12/1991 | Haddad et al. | 365/218 |
| 5,341,342 | 8/1994 | Brahmblatt | 365/185 |
| 5,355,332 | 10/1994 | Endoh et al. | 365/185 |

OTHER PUBLICATIONS

A Bergemont, et al.; "NOR Virtual Ground (NVG)–A New Scaling Concept for Very High Density Flash EEPROM and its Implementation in a 0.5um Process;" IEDM, Dec. 13, 1993, pp. 15–18.

R. Shirota, et al.; "A 2.3um square Memory Cell Structure for 16Mb NAND EEPROMs;" IDEM, Dec. 9, 1990, pp. 103–106.

G. Samachisa et al., "A128K Flash EEPROM Using Double–Polysilicon Technology", IEEE Journal of Solid-State Circuits, vol. SC–22, No. 5, Oct. 1987, pp. 676–683.

C. Chang et al., "Drain–Avalanche and Hole–Trapping Induced Gate Leakage in Thin –Oxide MOS Devices", IEEE Electron Device Letters, vol. 9, No. 11, Nov. 1988, pp. 588–590.

Haddadad et al., "Degradations Due toHole Trapping in Flash Memory Cells", IEEE Electronic Device Letters, vol. 10, No. 3, Mar. 1989, pp. 117–119.

T. C. Ong et al., "Erratric Erase in ETOX™ Flash Memory Array", VLSI Symposium, 1992, pp. 83–84.

K. Yoshikawa et al., "Comprarison of Current flash EEPROM Erasing Method: Stability and How to Control", IEDM, 1992, pp. 595–598.

(List continued on next page.)

Primary Examiner—David C. Nelms
Assistant Examiner—Vu A. Le
Attorney, Agent, or Firm—Raymond Kam-On Kwong

[57] ABSTRACT

A flash EEPROM cell array is erased by applying a relatively high positive voltage to the source region of the cell and a ground potential to the control gate of the cell while allowing the voltage of the drain region and the substrate region of the cell to float. By floating the substrate, the source current during erase is greatly reduced since the only DC current path is between the control gate and the source region. Since the source current is small, a double-diffused junction is not required so that the cell can occupy a minimum area for a given design rule and the cell fabrication process is simplified. In addition, the generation of high energy holes is suppressed and improved performance may be obtained. Because the source current is small during the erase operation, the high positive voltage at the source region can be generated by an on chip charge pump from a supply voltage as low as +3 V. This simplifies the design of memory boards on which many flash EEPROM chips are to be placed. Moreover, the after erase Vt distribution of the memory cell is tightened since a relatively high positive voltage is applied to the source region during erasure. Finally, there is no issue of yield sensitivity to defects in the channel, since during the erasure operation, electrons trapped in the floating gate pass through the overlap region between the source region and the control gate, instead of through the channel.

24 Claims, 5 Drawing Sheets

OTHER PUBLICATIONS

K. Oyama et al., "A Novel Erasing Technology for 3.3V Flash Memory with 64 MB Capacity and Beyond", IEDM, 1992, pp. 607–610.

S. Aritome et al., "A Reliable Bi-Polarity Write/Erase Technology In Flash EEPROMs", IEDM, 1990, pp. 111–114.

C. Chang et al., "Corner-Field Induced Drain Leakage In Thin Oxide Mosfets" IEDM, 1987, pp. 714–717.

FLASH EEPROM ARRAY WITH FLOATING SUBSTRATE ERASE OPERATION

This application is a file wrapper continuation of Ser. No. 08/267,726 filed Jun. 28, 1994, now abandoned.

FIELD OF INVENTION

The invention is generally related to floating gate memory devices such as EEPROMs and more specifically to a method for erasing flash EEPROMs arrays.

BACKGROUND OF THE INVENTION

There is a class of nonvolatile memory devices known as "flash EEPROMs" (electrical erasable programmable read only memory devices). The operation and structure of such devices is discussed in U.S. Pat. No. 4,698,787 issued Oct. 6, 1987, to Mukherjee et al., the disclosure of said patent being incorporated herein by reference. Another discussion respecting the operation and structure of flash EEPROM devices may be found in IEEE Journal of Solid State Circuits, Vol. SC-22, No. 5, October, 1987, pages 676–683 in an article entitled, "A 128K flash EEPROM Using Double-Polysilicon Technology" by Gheorghe Samachisa et al., the disclosure of said article being incorporated herein also by reference. A key feature of "flash" EEPROM's which distinguishes them from standard EEPROM's is that a select transistor is not included on a one-for-one basis with each floating gate transistor to select one memory cell for erasing. Instead, the memory cells of a flash EEPROM chip are erased in bulk, i.e., either the entire chip or by paged groups, commonly known as sectors. Each sector has a large number of floating gate transistors. For example, a 4 million bits (4 Mbit) flash EEPROM chip may have 8 equal size sectors of 64 thousand (64K) bytes each (each byte is equal to 8 bits and each bit is represented by one floating gate transistor). Typically, any combination of sectors, including all the sectors (i.e., the entire chip), can be concurrently erased. Elimination of the select transistor allows for smaller cell size and this gives the flash EEPROM an advantage in terms of manufacturing yield over a comparably sized (in terms of memory capacity) standard EEPROM.

A plurality of flash EEPROM cells may be formed on a semiconductor substrate (i.e., a silicon die) to each comprise a N-type source region integrally formed within a P portion of the substrate, a N-type drain region integrally formed within the P substrate portion and spaced apart from the source region, a P-type channel region interposed between the source and drain regions, a floating gate electrode insulatively spaced by a short distance (for example, 100 angstroms) above at least one of the source and drain regions, and a control gate electrode insulatively disposed above the floating gate electrode.

According to conventional operation, a flash EEPROM memory cell is "programmed" by inducing hot electron injection from a portion of the substrate (for example, a channel section near the drain region) to the floating gate. Electron injection carries negative charge into the floating gate. This injection mechanism is normally induced by grounding the source region and a bulk portion of the substrate, applying a relatively high positive voltage to the control electrode, for example, +12 Volts (V), to create an electron attracting field and applying a positive voltage of moderate magnitude (i.e., approximately +6 V to +9 V) to the drain region in order to generate "hot" (high energy) electrons. After sufficient negative charge accumulates on the floating gate, the negative potential of the floating gate raises the threshold voltage of its field effect transistor (FET) and inhibits current flow through the channel during a subsequent "read" mode. The magnitude of the read current is used to determine whether an EEPROM cell is programmed or not. Typically, in the read mode, a relatively low positive voltage, for example, +1.5 V, is applied to the drain, +5 V is applied to the control electrode and 0 V is applied to the source region of the memory cell.

The act of discharging the floating gate is called the erase function for a flash EEPROM cell. This erasure function is typically carried out by a Fowler-Nordheim tunneling mechanism between the floating gate and the source region of the transistor (source erase or negative gate erase) or between the floating gate and the substrate (channel erase).

A source erase operation is induced by applying a high positive voltage to the source region and a 0 V to the control gate and the substrate, while floating the drain of the respective memory cell. This positive voltage may be approximately +12 V.

While the source erase operation have the advantages of providing a tight after erase Vt distribution due to the use +12 V at the source for the erasure (a discussion of the control of after erase Vt distribution using high voltage source erase may be found in IEDM, 1992, pages 595–598 in an article entitled "Comparison of Current flash EEPROM Erasing Method: Stability and How to Control" by K. Yoshikawa et al., the disclosure of said article being incorporated herein by reference) and being insensitive to defects in the channel because all tunneling are through the small area of source to gate overlap, a number of drawbacks exist. First, an external power source of approximately +12 V is needed. Since different voltages, i.e., +4 V to +9 V, +5 V and +12 V, need to be applied to the drain and source regions of the device during programming, reading and erasure, it is often necessary to provide two off-chip power supplies for operating integrated circuit chips having such flash EEPROM's cells. There is a long-felt desire within the industry to develop a flash EEPROM integrated circuit chip which may be operated from only one power supply, i.e., +5 V or less. Unfortunately, the magnitude of source to substrate current tends to be relatively high during erasure, on the order of approximately 1 microamp per cell, and as a result, the power requirement of a memory chip having one million or more memory cells (a 1 megabit chip) can be as high as one ampere. Self-limiting techniques are often used for reducing this source to substrate current to levels of approximately 20 to 30 milliamps, but even at these levels, it is difficult to provide enough current from an on-chip charge pump circuit. An external power source of approximately +12 V or higher is needed.

A second drawback of the source erase technique is the difficulty in providing high density flash EEPROM cell arrays due to the requirement of a double-diffused source structure. When source erase technique is used, a relatively high reverse voltage is generated between the source and substrate during erasure. (The P-type substrate is at 0 V and the N+ type source region is at +12 V). A double-diffused source structure is normally employed (such as disclosed in Mukherjee, U.S. Pat. No. 4,698,787) to protect against undesirable reverse voltage breakdown of the source to substrate PN junction. The fabrication of a double-diffused structure requires an additional implantation step and a critical masking step which demands very precise alignment of the mask relative to the floating gate and the control gate of each cell within the flash EEPROM cell arrays. These additional steps, specifically the critical masking step, increase the cost and complexity of the fabrication process and reduce production yields. In addition, the double-diffused source structure occupies more substrate area than would otherwise be occupied by a single-diffused source structure and accordingly it is difficult to provide high density flash EEPROM cell arrays on relatively small dies in a cost-effective manner.

A third drawback associated with the source erasure of flash EEPROMs wherein a relatively high positive voltage (i.e., +12 V) is developed at the source region, is that there is a substantial probability that high energy holes ("hot" holes generated by a so called "avalanche effect") might be formed at a surface portion of the source to substrate junction and that these holes will become trapped in the thin dielectric underlying the floating gate. To a similar extent, there is a further danger that additional high energy holes will be generated by a so called band to band tunneling conduction mechanism and these will also be trapped in the gate dielectric. The distinction between avalanche generated holes and band to band generated is discussed in an IEEE paper entitled, "Drain-Avalanche and Hole-Trapping Induced Gate Leakage in Thin-Oxide MOS Devices" by Chi Chang, et al., IEEE Electron Device Letters, Vol. 9, No. 11, November, 1988, pages 588–590. This article is incorporated herein by reference.

The production of avalanche generated holes at the surface of the dielectric below the floating gate is undesirable because it can interfere with reliable programming, reading and erasure of randomly located memory cells (i.e., the gate disturb phenomenon), because it tends to decrease the charge retention time of the floating gate (holes trapped in the gate dielectric can migrate upwardly into the floating gate to neutralize the negative program charges in the floating gate). Specifically, during erasure, some memory cells may produce more hot holes than others and consequently their floating gates will be discharged at a faster rate. This creates a non-uniform erasure throughout the memory chip. Those holes which do not migrate to the floating gate during erasure can remain in the dielectric for random periods of time and then migrate to the floating gate, where they neutralize charge that is to be retained. Furthermore, during programming, trapped holes in the dielectric can cause undesirable programming of nonselected cells. These undesirable phenomena are further described in an article entitled, "Degradations Due to Hole Trapping in Flash Memory Cells" by Sameer Haddad et al., IEEE Electron Device Letters, Vol. 10, No. 3, March, 1989, pages 117–119; said article being incorporated herein by reference. A further disadvantage of operation in the avalanche breakdown region is that it increases the magnitude of source current during erasure.

A fourth drawback of the source erase technique is due to electron and hole injection into the source region, causing mobility degradation on the source region. This degradation may impair the performance of the flash EEPROM cell.

A negative gate erase operation is induced by applying +5 V to the source region, a negative voltage to the control gate and 0 V to the substrate, while floating the drain of the respective memory cell. This negative voltage may be as much as −10 V. One of the advantages of the negative gate erase technique is the reduction in the source voltage to +5 V during erasure which substantially reduce the probability of high energy holes resulting in improved reliability. The other advantages of the negative gate erase technique is that it only requires a single +5 V power supply (instead of a +12 V power supply as in the case of the source erase technique) and it is insensitive to defects in the channel because all tunneling are through the small area of source to gate overlap. However, a number of drawbacks may be associated with the negative gate erase operation.

First, a negative charge pump is needed to provide the −10 V required at the control gate for erasure. Also, in case of a +3 V supply voltage operation, a positive charge pump may also be needed to provide the +5 V required for the source region during erasure. A second drawback is that the negative gate erase technique fails to provide high density EEPROM cell arrays because a double-diffused source structure is found to be necessary in many instances. Third, the after erase threshold voltage (Vt) distribution of the flash EEPROM cells is wider, which is undesirable. A tight after erase $V_t$ distribution is desirable because designed safety margins accounting for the distribution of the threshold voltages, especially sense amplifiers, can be reduced.

A channel erase operation is induced by applying a high positive voltage to the substrate and a 0 V to the control gate, while floating both the source and the drain regions of the respective memory cell. This positive voltage may be as high as +12 V. One of the advantages of the channel erase technique is that a single-diffused source structure can be used, which allows a reduction in the size of the memory cells, resulting in a flash EEPROM array with higher density. The other advantage is that a separate +12 V power supply is not needed since the substrate high voltage can be pumped from a +3 V power supply. Furthermore, since the source is floating, there is generally no high energy holes related reliability problem.

Again, a number of drawbacks may be associated with the channel erase operation. First, since the erase involved tunneling through the whole channel, the channel erase operation is very sensitive to defects found in the channel. This could lead to potential yield problems. Second, the after erase Vt distribution of the flash EEPROM cells is widest among the three conventional erase techniques, which is very undesirable.

Hence, there is a need to have a method and a flash EEPROM memory cell structure that allows erasure operation with the advantages of the conventional erasure techniques in combination, while minimizing the drawbacks associated with such conventional techniques. The present invention addresses such a need.

SUMMARY OF THE INVENTION

One aspect of the invention is to improve the effectiveness of charge pumping from +3 V to a high positive voltage to be applied to the source region during erasure of memory cells in a flash EEPROM array.

Another aspect of the invention is to reduce the source current of a memory cell during erasure which then allow the use of a single-diffused source region in the cell.

A further aspect of the invention is to increase the density of a flash EEPROM cell arrays by using single-diffused source regions on the memory cells.

Another aspect is to simplify the fabrication process of a flash EEPROM cell arrays by using single-diffused source regions in the memory cells which eliminates at least one implantation and one critical masking step.

A further aspect of the invention is to improve the reliability of a memory cell by minimizing substrate current during erasure which suppresses the formation of high energy holes.

Another aspect is to simplify circuit design of the flash EEPROM by eliminating the use of negative charge pump.

Still another aspect is to tighten the after erase Vt distribution of a memory cell by applying a high positive voltage to the source region during erasure.

Yet another aspect is to minimize the yield sensitivity to defects in the channel by erasing a flash EEPROM cell through the overlap region between the source and the gate regions.

Additional aspects, advantages and novel features of the invention will be set forth in part in the description which follows, and in part will become apparent to those skilled in the art upon examination of the following or may be learned by practice of the invention. The aspects and advantages of the invention may be realized and attained by means of the instrumentalities and combinations particularly pointed out in the appended claims.

In accordance with these aims and aspects, the present invention is concerned with the provision of a method for erasing a memory cell formed on a substrate. The memory cell includes a floating gate, a control gate positioned over the floating gate, a source region and a drain region. The method comprises the steps of applying a first voltage to the source region, applying a second voltage to the control gate and allowing the substrate to float.

In another aspect, the first positive voltage is in the range of approximately +5 V to +12 V and the second voltage is less than or equal to 0 V.

The present invention is also concerned with the provision of a method for controlling a flash EEPROM memory cell, formed on a substrate, which uses Fowler-Nordheim tunneling for erasure. The memory cell includes a source region, a channel region, a drain region, a floating gate positioned over the channel region and a control gate positioned over the floating gate. The source region is single-diffused which simplifies the fabrication process and reduces cost. In addition, a single-diffused source region reduces the length of the channel region which allow for a smaller memory cell. The method of controlling the memory cell during erasure comprises applying a first positive voltage to the source region, applying a second non-positive voltage to the control gate, and allowing the substrate to float.

In accordance with another aspect of the invention, the method further comprises the step of, performing an over-erased bit Vt correction so as to obtain a tight after erase threshold voltage distribution. The step of overerased bit Vt correction comprises applying a third voltage to the source region, applying a fourth voltage to the control gate, applying a fifth voltage to the substrate and applying a sixth voltage to the drain region.

The present invention is also concerned with the provision of a memory cell which is programmable and erasable. The memory cell comprises a first substrate of a first type, a single-diffused source region of a second type formed on the first substrate, a drain region of the second type formed on the first substrate, a channel of the first type formed on the first substrate, a floating gate positioned over said channel, and a control gate positioned over the floating gate. The channel is positioned between the source region and the drain region. The source region is single-diffused in order to minimize the length of the channel so that a smaller memory cell can be formed.

The present invention is also concerned with the provision of a flash EEPROM which comprises an army of programmable and erasable memory cells, a plurality of bit lines, and a plurality of word lines. The memory cells are organized in rows and columns. Each memory cell comprises a first substrate of a first type, a source region of a second type formed on the first substrate, a drain region of the second type formed on the first substrate, a channel of the first type formed on the first substrate, a floating gate positioned over said channel, and a control gate positioned over said floating gate. The channel is positioned between the source region and the drain region. The source region is single-diffused in order to minimize the length of the channel so that a smaller memory cell can be formed. Each bit line is coupled to the drains of one of the columns of cells in the array and each word line is coupled to the gates of one of the rows of cells in the army.

In accordance with another aspect of the invention, each memory cell further includes a second substrate of the first type, and a deep well of the second type formed on the second substrate. The first substrate is formed on the deep well.

In yet another aspect, the flash EEPROM further includes means for allowing the first substrate to float during erasure of the memory cells.

Still other aspects and advantages of the present invention will become readily apparent to those skilled in this art from the following detailed description, wherein only the preferred embodiment of the invention have been shown and described, simply by way of illustration of the best mode contemplated by the inventors of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

By using a floating substrate erasure technique, the methods and structures of the invention provide compatibility with a lower supply voltage, for example, +3 V, allow the use of single-diffused source region which simplifies the fabrication process and increase the density of the memory cells, improve reliability by suppressing the formation of high energy holes, simplify circuit design by eliminating the use of negative charge pump, tighten the after erase Vt distribution, and minimize yield sensitivity to defects in the channel.

DETAILED DESCRIPTION OF THE PREFERRED EMBODIMENTS

The following detailed description is of the best modes presently contemplated by the inventors for practicing the invention. It should be understood that the descriptions of these preferred embodiments is merely illustrative and that they should not be taken in a limiting sense.

Figure 1A:
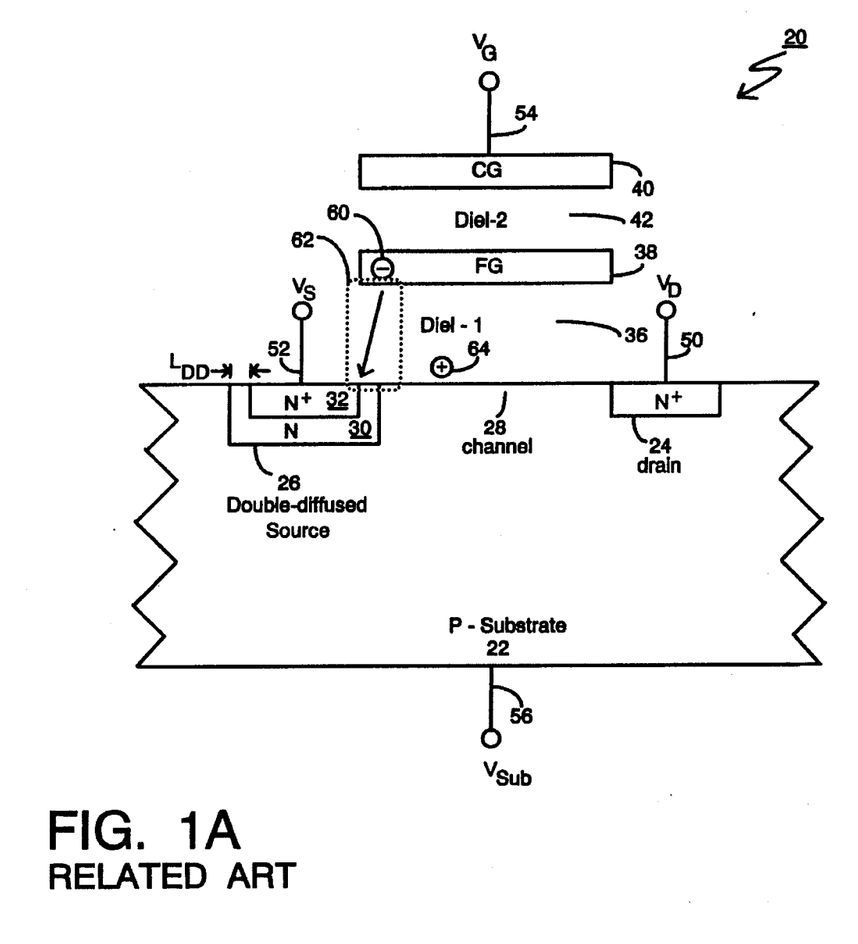
FIG. 1A is a cross-sectional view of memory cell in a flash EEPROM array which uses the source erase technique for erasure.

Referring to FIG. 1A, there is shown a cross-sectional view of memory cell 20 in a flash EEPROM array which uses the source erase technique for erasure. It is to be understood that a large number, N×M (i.e., 1,000 or more), of such cells 20 are typically provided on a single integrated circuit chip in an N×M matrix form and that the power requirements of the entire chip are N×M times that of a single cell 20.

As seen in FIG. 1A, a flash EEPROM cell 20 may be formed on a P-type substrate 22 having embedded therein a N+ drain region 24, a N-type double-diffused source region 26 and a channel region 28 positioned between the drain region 24 and the double-diffused source region 26. The double-diffused source region 26 is formed of a deeply diffused but lightly doped N well 30 (phosphorous doped), commonly known as Double-diffused Junction (DDJ), and a more heavily doped but shallower N+ well 32 (arsenic doped) embedded within the DDJ 30. The DDJ 30 diffuses outwardly from the shallow well 32 to a dimension which is twice a double diffusion length, $L_{DD}$ as denoted in FIG. 1A. A relatively thin gate dielectric layer 36 (i.e., oxide with thickness of approximately 100 angstroms) is interposed between the surface of the substrate 22 and a conductive polysilicon floating gate 38. A polysilicon control gate 40 is insulatively supported above the floating gate 38 by an interpoly dielectric layer 42. A drain terminal 50, a source terminal 52, a control gate terminal 54 and a substrate terminal 56 is respectively coupled to the drain region 24, the source region 26, the control gate 40 and the P-substrate 22 for receiving voltage.

In the case of programming, it is desirable to program a specific one memory cell 20 in a specific row and column while inhibiting the programming of other memory cells provided on the memory chip. During programming, the source region 26 and the substrate 22 of the to-be-programmed memory cell is tied to ground via terminal 52 and terminal 56 respectively, the drain region 24 is coupled to a relatively high voltage (for example, +5 V to +9 V) via terminal 50 and the control gate 40 is connected to a relatively high voltage level (for example, +10 V) via terminal 54. Electrons are accelerated from the source region 26 to the drain region 24 and so-called "hot-electrons" are generated near the drain region 24. Some of the hot electrons are injected through the relatively thin gate dielectric 36 (Diel-1) and become trapped in the floating gate (FG) 38 thereby giving FG 38 a negative potential. This programming mode requires relatively large currents from an off chip power supply.

During erasure, a high positive voltage $V_S$=+12 V is applied to the source region 26 via source terminal 52. A ground potential $V_G$=0 V is applied to the control gate 40 via control terminal 54. A ground potential $V_{Sub}$=0 V is applied to the substrate 22 via substrate terminal 56. The voltage $V_D$ of the drain region 54 is allowed to float. In this mode, electrons 62 previously stored during programming in the floating gate 38 pass through a floating gate to source overlap area 62 by way of Fowler-Nordheim tunneling and travel into the source region 26 as a result of the electric field established between the control gate 40 and the source region 26 ($V_{GS}$=12 V). Typically, all cells are programmed before bulk erasure commences.

The source region 26 is reverse biased relative to the P-type substrate 22 during the erase mode as a result of the positive voltage +12 V applied at the source terminal 52. High energy holes 64 may be generated in the tunneling region 62 of the substrate surface primarily as a result of the so-called avalanche effect and to a lesser extent as a result of the so-called band-to-band conduction effect, and these holes 64 may become trapped in the thin gate dielectric layer 36. (Did-1).

Several disadvantages arise from operating the source region 26 at the high voltage level of approximately +12 V and the substrate 22 at 0 V. This high voltage is responsible for the generation of a large number of hot holes 64 created by the avalanche effect. The ability of the floating gate 38 to retain negative charge (electrons) when the cell 20 is not being erased (data retention time), is degraded by trapped holes because these trapped holes have a tendency to migrate to the floating gate 38 and to neutralize the negative charge therein. The magnitudes of the source current and corresponding power that are needed for erasing each cell 20 in a large N×M array of such cells is significantly increased because of avalanche phenomenon. Two separate power supplies, +5 V and +12 V, each having significant current and/or power supplying capabilities are therefore required for operating the integrated memory circuit in the programming and bulk erase modes.

As explained earlier, other drawbacks of the source erase techniques are the requirement of a double-diffused source structure which undesirably increase the size of the memory cells and the injection of electrons into the source region causing mobility degradation at the source region.

Figure 1B:
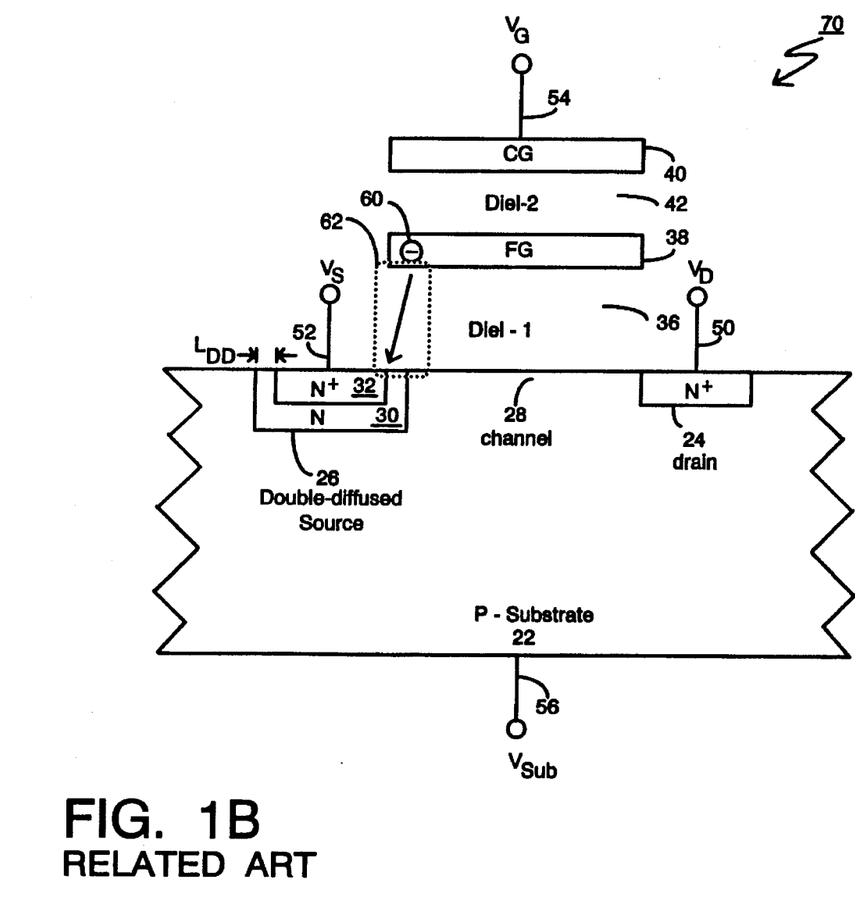
FIG. 1B is a cross-sectional view of memory cell in a flash EEPROM array which uses the negative gate erase technique for erasure.

Referring to FIG. 1B, there is shown a cross-sectional view of similar memory cell 70 in a flash EEPROM array which uses the negative gate erase technique for erasure. Like reference numerals are used in FIG. 1B to denote like elements already described for FIG. 1A. The programming mode of the memory cell 70 is identical to that of the memory cell 20 as described above.

During erasure, a positive voltage $V_S$=+5 V is applied to the source region 26 via source terminal 52. A negative potential $V_G$=−10 V is applied to the control gate 40 via control terminal 54. A ground potential $V_{Sub}$=0 V is applied to the substrate 22 via substrate terminal 56. The voltage $V_D$ of the drain region 24 is allowed to float. In this mode, electrons 60 previously stored during programming in the floating gate 38 pass through a floating gate to source overlap area 62 by way of Fowler-Nordheim tunneling and travel into the source region 26 as a result of the electric field established between the control gate 40 and the source region 26 ($V_{GS}$=−15 V).

As aforementioned, the drawbacks of the negative gate erase technique include the possible requirement of a double-diffused source structure which undesirably increase the size of the memory cells, the requirement of a negative (−10 V) and a positive (+5 V) charge pump during erasure for +3 V supply voltage operation, and a wider after erase Vt distribution.

Figure 1C:
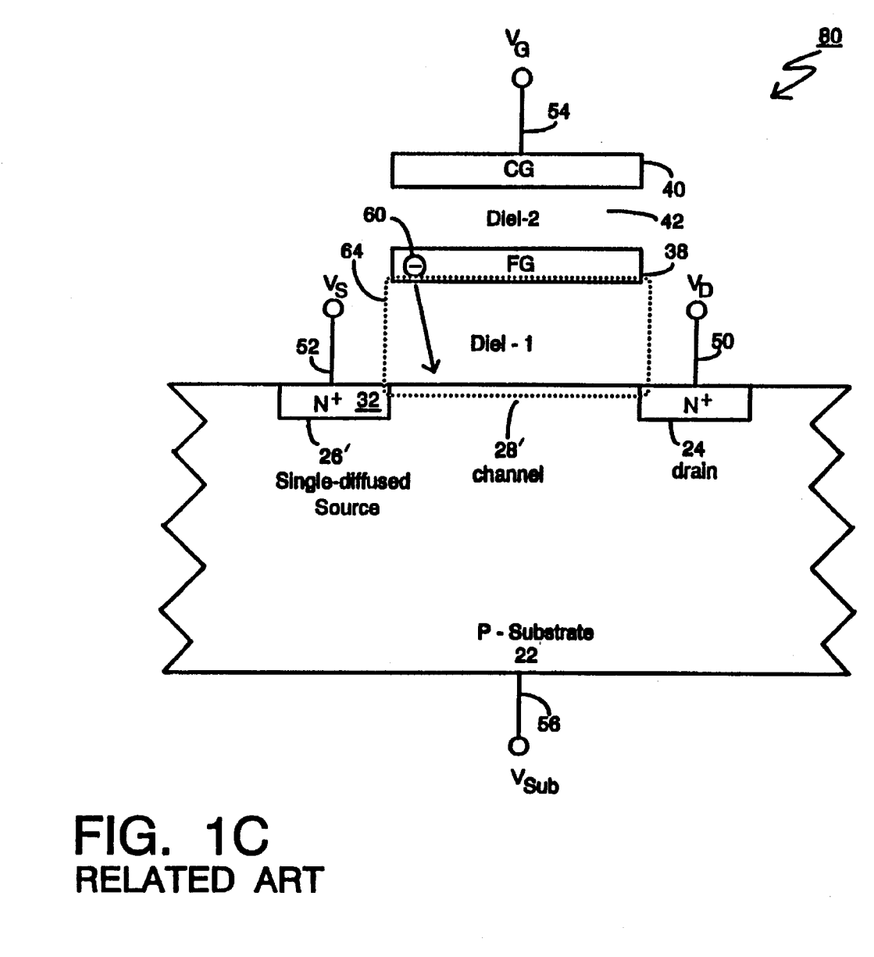
FIG. 1C is a cross-sectional view of memory cell in a flash EEPROM array which uses the channel erase technique for erasure.

Referring to FIG. 1C, there is shown a cross-sectional view of a similar memory cell 80 in a flash EEPROM array which uses the channel erase technique for erasure. Like reference numerals are used in FIG. 1C to denote like elements already described for FIG. 1A. The programming mode of the memory cell 80 is identical to that of the memory cell 20 as described above.

During erasure, a high positive voltage $V_{Sub}$=+12 V is applied to the substrate region 22 via substrate terminal 56. A ground potential $V_G$=0 V is applied to the control gate 40 via control terminal 54. The voltage $V_D$ of the drain region 24 and the voltage $V_S$ of the source region 26' are allowed to float. In this mode, electrons 60 previously stored during programming in the floating gate 38 pass through a floating gate to channel overlap area 64 by way of Fowler-Nordheim tunneling and travel into the substrate region 22 as a result of the electric field established between the control gate 40 and the source region 26 ($V_{GS}$=–12 V).

As explained earlier, even though the channel erase technique allows the elimination of DDJ which results in a channel 28' that is shorter in length and hence a smaller memory cell 80, there are a number of drawbacks associated with this technique. Yield problem due to the sensitivity of the operation to defects in the channels of the memory cells and the widest after erase Vt distribution in comparison with other conventional erasure methods, are the primary drawbacks of the channel erasure technique. Due to these drawbacks, channel erasure technique is not desirable.

Figure 2A:
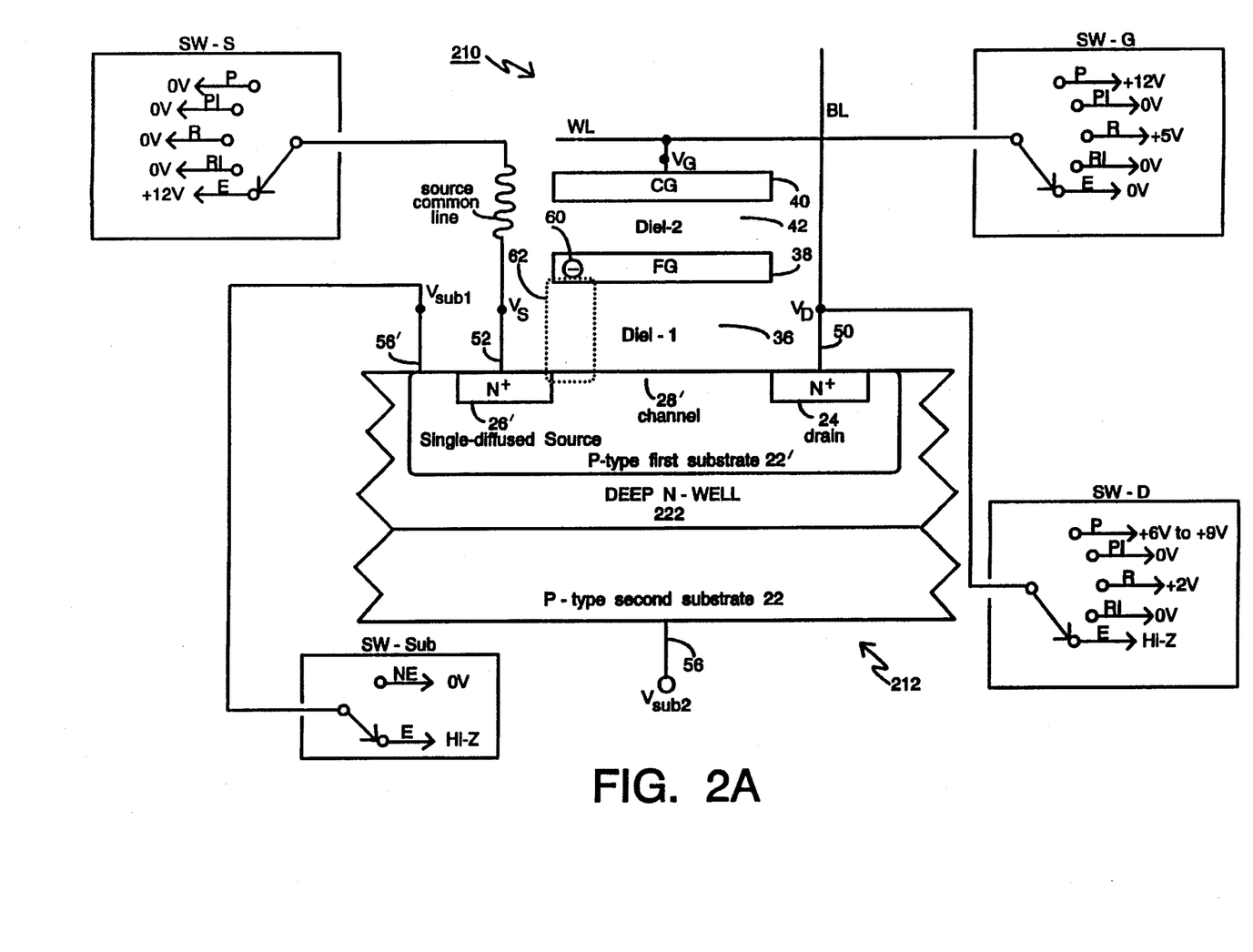
FIG. 2A is a cross-sectional view of memory cells in a flash EEPROM array which uses the floating substrate erase technique for erasure in accordance with the present invention.

Referring to FIG. 2A, a flash EEPROM cell 212 is shown to be driven by operating circuitry 210, all constructed according to the present invention. Like reference numerals are used in FIG. 2A to denote like elements already described for FIG. 1A.

It is to be understood that a large number, N×M (i.e., 1,000 or more), of such cells 212 are typically provided on each sector of a single integrated memory circuit chip in an N×M matrix form. Typically, each memory circuit may include 4 to 16 sectors. The power requirements of the entire memory chip 250 (as shown in FIG. 2B) equals to the number of sectors×N×M times that of a single cell 212.

As seen in FIG. 2A, a flash EEPROM cell 212 may be formed on a P-type first substrate 22' having embedded therein a N+ drain region 24 and a N+ single-diffused source region 26'. The P-type first substrate 22' is formed on a deep N-well 222. In this embodiment, memory chip 250 (FIG. 1B) includes a plurality of sectors. In this case, there is one deep N-well 222 in each sector and accommodates all N×M matrix of memory cells in the respective sector. The deep N-well 222 is formed on the P-type second substrate 22.

Since, double-diffused source region is not required, the length of channel 28' can be reduced which allows for a smaller memory cell 212, while at the same time, simplifies the fabrication process by eliminating at least one implantation and one critical masking step and reduces cost. The construction of the control gate 40, floating gate 38, and the dielectric layers (Diel-1 and Diel-2) 36 and 42 are identical to what have been described in FIG. 1A.

Figure 2B:
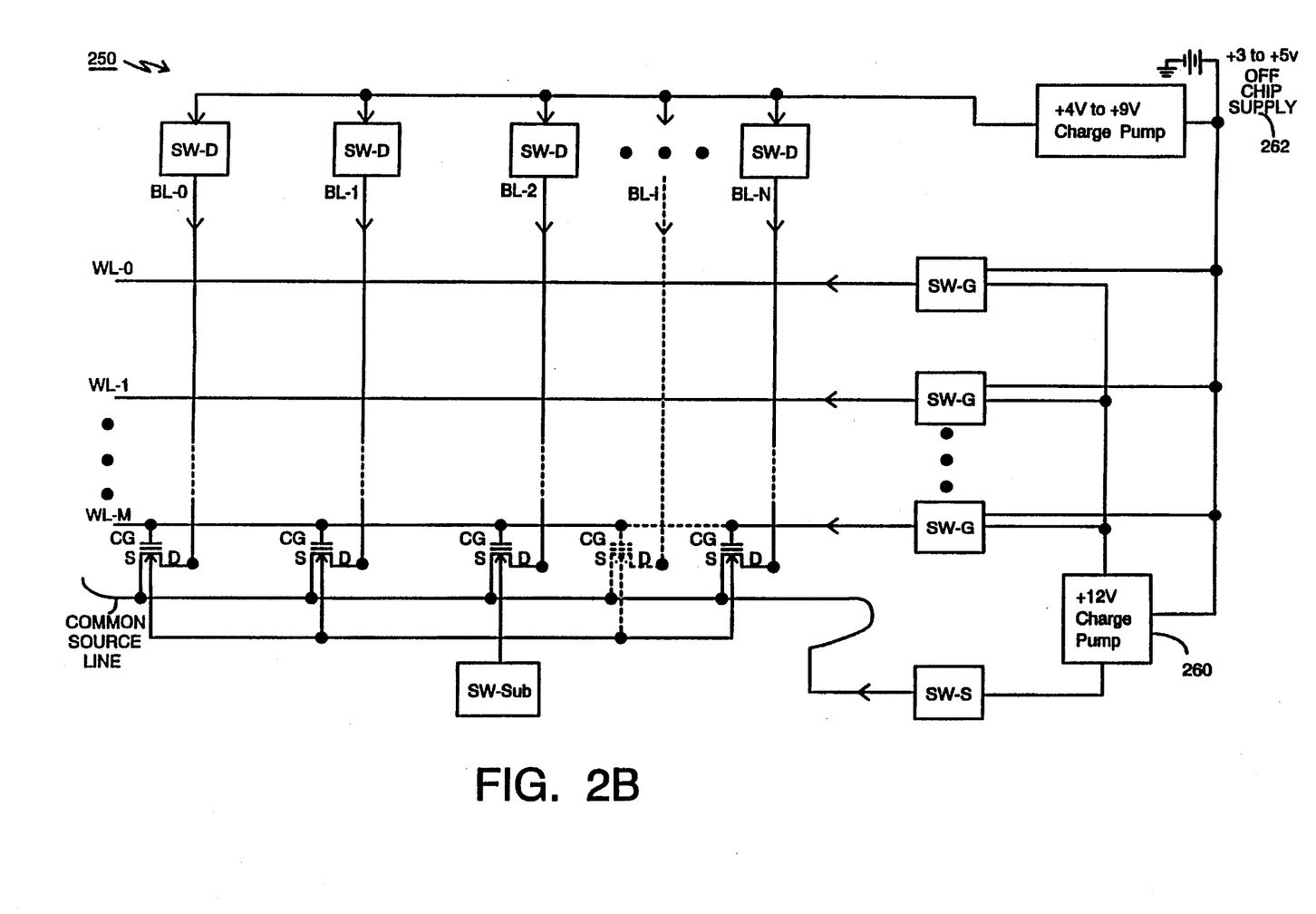
FIG. 2B is a chip layout diagram showing how plural flash EEPROM memory cells in a sector are positioned relative to their drive circuitry in a flash EEPROM memory chip according to the present invention.

FIG. 2B illustrates how a plurality of N×M (for example, one thousand, one million, etc.) flash EEPROM memory cells in a sector are positioned relative to their drive circuitry in a memory chip 250. The memory cell 212 is provided in an orderly, matrix-like fashion. As shown in FIG. 2B, the upper polysilicon layer which forms the control gate 40 is patterned to define M horizontally extending word lines (WL). An insulated and overlying layer of metal (metal-1 layer) is patterned to form N vertically extending bit lines (BL) which cross over the M horizontally extending word lines (WL) to define a cell addressing grid. Each memory cell 212 of the array is positioned at the intersection of a word line (WL) with a bit line (BL). The control gate (CG) 40 of each memory cell is defined by an overlying word line (WL) while the drain region 24 is tied to an overlying bit line (BL). A common source line (formed by a conductive path diffused in the substrate) couples the source regions 26' of all the memory cells 212 one to the next.

Referring to FIG. 2A, the circuitry 210 for operating each memory cell will now be explained. The operating circuitry 210 comprises a source switching circuit SW-S which is connected to the source regions 26' of all cells 212 through the source common line. A gate switching circuit SW-G is provided for each of the horizontally extending word lines (WL) to drive a corresponding row of memory cells. A drain switching circuit SW-D is provided for each of the vertically extending bit line (BL) to drive a corresponding column of memory cells 212. There is one substrate switching circuit SW-Sub per sector, which is operatively coupled to the first substrate 22' shared by all the memory cells 212 in the respective sector.

The three switching circuits, SW-S, SW-G and SW-D, are each shown to have five switching positions in FIG. 2A. These five switching positions are respectively labeled as "P" to denote a cell programming mode, "PI" to denote a row or column programming inhibit mode, "R" to denote a cell reading mode, "RI" to denote a row or column read inhibit mode and "E" to denote a cell erasing mode. The switching circuit SW-Sub is shown to have two switching positions in FIG. 2A. These two switching positions are respectively labeled as "E" to denote a cell erasing mode and "NE" to denote a mode other than the cell erasing mode.

During programming, it is desirable to program a specific one memory cell 212 in a specific row and column while inhibiting the programming of other memory cells provided on the memory chip. The operating switches SW-S, SW-G and SW-D of rows and columns that are not to be programmed are each set to the program inhibit (PI) position. The operating switches SW-S, SW-G and SW-D of the row and column of a cell 212 which is to be programmed are differentially set to the cell programming position (P). The operating switch SW-Sub which couples to all the memory cells in the sector is set to NE. In this programming position (P), the source 26' of the to-be-programmed memory cell is tied to ground, the drain 24 is tied to a relatively high voltage (for example, +4 V to +9 V), the control gate 40 is connected to a relatively high voltage level (for example, +12 V), and the P-type substrate 22' is tied to the ground voltage of 0 V. Electrons are accelerated from the source 26' to the drain 24 and so-called "hot electrons" are generated near the drain region 24. Some of the hot electrons are injected through the relatively thin gate dielectric 36 (Diel-1 ) and become trapped in the floating gate (FG) 38 thereby giving FG 38 a negative potential.

When a desired cell in a predetermined row and column is to be read, the operating switches SW-S, SW-G and SW-D of all other rows and columns are placed in the read inhibit position (RI) and the operating switches SW-S, SW-G and SW-D of the row and column of the cell that is to be read are placed in the read position (R). Again, the operating switch SW-Sub which couples to all the memory cells in the sector is set to NE.

During erasure of a sector, all the operating switches of all memory cells in the sector are placed in the cell erasing position (E). A relatively high positive voltage $V_S$=+12 V is applied to each source region 26'. A ground potential $V_G$ 0 V is applied to each control gate 40. The P-type first substrate voltage $V_{Sub1}$ of each memory cell is allowed to float, i.e., at high impedance (Hi-Z). The voltage $V_D$ of each drain region 24 is allowed to float. In this mode, electrons 60 previously stored during programming in the floating gate 38 pass through a floating gate to source overlap area 62 by way of Fowler-Nordheim tunneling and travel into the source region 26' as a result of the electric field established between the control gate 40 and the source region 26' ($V_{GS}$=–12 V).

By floating the P-type first substrate 22', the source current during erase is greatly reduced since the only DC current path is between the control gate 40 and the source region 26'. This current is the Fowler-Nordheim current used to erase the cell. Since the source current is small, a double-diffused source region is not required. When the source region 26' is single-diffused, the double diffusion overlap distance $L_{DD}$ is no longer present. Accordingly, the area on the substrate required for forming the source region is less than that required for forming a double-diffused source region, an cell size can thereby be reduced by utilizing a single-diffused source region instead. A reduction in cell size of approximately 10% may be realized. Furthermore, this simplifies the fabrication process of the flash EEPROM cell arrays because it eliminates at least one implantation and one critical masking step, which simplifies the fabrication process and reduces cost.

In addition, since the source current is small during the erase operation, the high positive voltage of +12 V at the source region 26' can be generated by an on chip charge pump 260 using an off chip (external) power supply 262 with supply voltage as low as +3 V. Hence only one external power supply is needed for powering the chip during the erasure mode. This simplifies the design of memory boards on which many flash EEPROM chips are to be placed.

Besides, negative charge pump is not required since there is no negative voltage requirement for the erasure operation. This simplifies the design of the flash EEPROM.

Furthermore, the reliability of memory cell 210 is improved because substrate current during erasure is substantially reduced by allowing the potential of the P-type first substrate 22' to float. This greatly suppresses the formation of high energy holes.

Moreover, the after erase Vt distribution of the memory cell 210 is tightened since a high positive voltage of +12 V is applied to the source region 26' during erasure.

Further, by forming the flash EEPROM memory cells in a P-type first substrate 22' over a deep N-well 222, a negative voltage in the range of approximately 0 V to −5 V (for example, −3 V), can be applied to the P-type first substrate 22' during programming or during after erase Vt correction of overerased bits, which is commonly known as overerased bit Vt correction. This results in an increase in both the Vt (due to what is commonly known as "body effect") and the electric field at the drain junction during programming and overerased bit Vt correction, which provide the advantages of reducing the currents (thus ease the minimum current requirement of charge pump design), increasing the speed and/or reducing the voltages during programming and/or overerased bit Vt correction.

Finally, there is no issue of yield sensitivity to defects in the channel 28, since during the erasure operation, the electrons 60 pass through the overlap region 62 between the source region 26' and the control gate 40, instead of through the channel 28 as in the case of the channel erase operation.

The above described embodiments are merely illustrative of the invention. Various alternate designs will become apparent to those skilled in the art after reading the above disclosure. For example, the invention may be applied to so-called split gate transistors wherein Fowler-Nordheim erasure is carried through the drain rather than through the source region. It is to be understood that the scope of the invention is not limited merely to the above described embodiments.

What is claimed is:

1. A method for erasing a memory cell formed on a substrate, the memory cell having a floating gate, a control gate positioned over the floating gate, a source region and a drain region, the method comprising the steps of:

(a) applying a first voltage to the source region;

(b) applying a second voltage to the control gate; and (c) allowing the substrate to float.

2. The method as recited in claim 1, further comprising the step of allowing the drain region to float.

3. The method as recited in claim 1, wherein said first voltage is a positive voltage.

4. The method as recited in claim 3, wherein said first voltage is in the range of approximately +5 volts to +12 volts.

5. The method as recited in claim 1, wherein said second voltage is less than or equal to 0 volt.

6. The method as recited in claim 5, wherein said second voltage is in the range of approximately 0 volt to −10 volts.

7. A method for erasing a memory cell formed on a substrate, said memory cell having a floating gate, a control gate positioned over the floating gate, a source region and a drain region, the source region being single-diffused, the method comprising the steps of:

(a) applying a first voltage to the source region;

(b) applying a second voltage to the control gate; and (c) allowing the substrate to float.

8. A method for controlling a flash EEPROM memory cell using Fowler-Nordheim tunneling for erasure, the memory cell being formed on a substrate, the memory cell having a source region, a channel region, a drain region, a floating gate positioned over the channel region and a control gate positioned over the floating gate, the source region being single-diffused to minimize the length of the channel region, the method comprising the steps of, during erasure of the memory cell:

(a) applying a first positive voltage to the source region;

(b) applying a second non-positive voltage to the control gate; and (c) allowing the substrate to float.

9. The method as recited in claim 8, further comprising the step of allowing said drain region to float.

10. The method as recited in claim 8, wherein said first positive voltage is in the range of approximately +5 volts to +12 volts.

11. The method as recited in claim 10 wherein said second non-positive voltage is in the range of approximately 0 volt to −10 volts.

12. The method as recited in claim 8, further comprising the step of, performing an overerased bit Vt correction so as to obtain a tight after erase threshold voltage distribution, wherein the step of overerased bit Vt correction comprises:

(a) applying a third voltage to the source region;

(b) applying a fourth voltage to the control gate;

(c) applying a fifth voltage to the substrate; and (d) applying a sixth voltage to the drain region.

13. The method as recited in claim 12, wherein said third voltage, said fourth voltage and said fifth voltage are approximately 0 volts, and said sixth voltage is approximately +5 volts.

14. The method as recited in claim 8, further comprising the step of programming the memory cell using hot electron injection, wherein said step of programming comprises:

(a) applying a third voltage to said source region;

(b) applying a fourth voltage to said control gate;

(c) applying a fifth voltage to said substrate; and (d) applying a sixth voltage to said drain region.

15. The method as recited in claim 14, wherein said third voltage is approximately 0 volt, said fourth voltage is approximately +12 volts, said fifth voltage is equal to or less than 0 volt, and said sixth voltage is in the range of approximately +4 volts to +9 volts.

16. The method as recited in claim 15, wherein said fifth voltage is in the range of approximately 0 volt to −5 volts.

17. A method for erasing memory cells within a flash EEPROM array using Fowler-Nordheim tunneling, each cell being defined on one of a plurality of first substrates of a first type, the plurality of first substrates of the first type being formed on a deep well of a second type, the deep well of the second type being formed on a second substrate of the first type, each cell including a source region of the second type, a drain region of the second type, a channel of the first type formed on the first substrate, the channel being positioned between the source region and the drain region, a floating gate positioned over the channel and a control gate positioned over the floating gate, each source region being single-diffused so as to minimize the length of the channel, the method comprising the steps of:

(a) applying a first voltage to the source regions, said first voltage is in the range of approximately +5 volts to +12 volts;

(b) applying a second voltage to the control gates; said second voltage is in the range of approximately 0 volt to −10 volts; and (c) allowing the first substrates to float.

18. The method as recited in claim 17, further comprising the step of performing an overerased bit Vt correction so as to obtain a tight after erase threshold voltage distribution for the memory cells, wherein the step of overerased bit Vt correction comprises:

(a) applying a third voltage to the source regions, said third voltage is approximately 0 volt;

(b) applying a fourth voltage to the control gates, said fourth voltage is approximately 0 volt;

(c) applying a fifth voltage to the first substrates, said fifth voltage is equal to or less than 0 volt; and (d) applying a sixth voltage to the drain regions, said sixth voltage is approximately +5 volts.

19. The method as recited in claim 17, further comprising the programming steps of:

(a) applying a third voltage to the source regions, said third voltage is approximately 0 volts;

(b) applying a fourth voltage to the control gates, said fourth voltage is approximately +12 volts;

(c) applying a fifth voltage to the first substrates, said fifth voltage is equal to or less than 0 volt; and (d) applying a sixth voltage to the drain regions, said sixth voltage is in the range of approximately +4 volts to +9 volts.

20. The method as recited in claim 19, wherein said voltage is in the range of approximately 0 volt to −5 volts.

21. A method for controlling the operations of memory cells within a flash EEPROM memory array using Fowler-Nordheim tunneling for erasure and hot electron injection for programming, each cell being defined on one of a plurality of first P-type substrates, the plurality of first P-type substrates being formed on a deep N-type well, the deep N-type well being formed on a second P-type substrate, each cell including a N-type source region, a N-type drain region, a P-type channel formed on the first substrate, the channel being positioned between the source region and the drain region, a floating gate positioned over the channel and a control gate positioned over the floating gate, each source region being single-diffused so as to minimize the length of the channel, the method comprising the erasure steps of:

(a) applying a first voltage to the source regions, said first voltage is in the range of approximately +5 volts to +12 volts;

(b) applying a second voltage to the control gates, said second voltage is in the range of approximately 0 volt to −10 volts; and (c) allowing the first substrates to float.

22. The method as recited in claim 21, further comprising the step of performing an overerased bit Vt correction so as to obtain a tight after erase threshold voltage distribution for the memory cells, wherein the step of overerased bit Vt correction comprises:

(a) applying a third voltage to the source regions, said third voltage is approximately 0 volts;

(b) applying a fourth voltage to the control gates, said fourth voltage is approximately 0 volts;

(c) applying a fifth voltage to the first substrates, said fifth voltage is equal to or less than 0 volts; and (d) applying a sixth voltage to the drain regions, said sixth voltage is approximately +5 volts.

23. The method as recited in claim 21, further comprising the programming steps of:

(a) applying a third voltage to the source regions, said third voltage is approximately 0 volt;

(b) applying a fourth voltage to the control gates, said fourth voltage is approximately +12 volts;

(c) applying a fifth voltage to the first substrates, said fifth voltage is equal to or less than 0 volt; and (d) applying a sixth voltage to the drain regions, said sixth voltage is in the range of approximately +4 volts to +9 volts.

24. The method as recited in claim 23, wherein said fifth voltage is in the range of approximately 0 volt to −5 volts.

* * * * *